US009419061B2

(12) United States Patent
Lee et al.

(10) Patent No.: US 9,419,061 B2
(45) Date of Patent: Aug. 16, 2016

(54) ORGANIC LIGHT-EMITTING DISPLAY APPARATUS AND METHOD OF MANUFACTURING THE SAME

(71) Applicant: Samsung Display Co., Ltd., Yongin, Gyeonggi-do (KR)

(72) Inventors: Iljeong Lee, Yongin (KR); Sewan Son, Yongin (KR); Youngwoo Park, Yongin (KR); Wangwoo Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 50 days.

(21) Appl. No.: 14/700,454

(22) Filed: Apr. 30, 2015

(65) Prior Publication Data

US 2016/0118447 A1    Apr. 28, 2016

(30) Foreign Application Priority Data

Oct. 24, 2014  (KR) .................. 10-2014-0145390

(51) Int. Cl.
| H01L 27/14 | (2006.01) |
| H01L 29/04 | (2006.01) |
| H01L 29/15 | (2006.01) |
| H01L 31/036 | (2006.01) |
| H01L 27/32 | (2006.01) |
| H01L 27/12 | (2006.01) |

(52) U.S. Cl.
CPC .......... H01L 27/3244 (2013.01); H01L 27/124 (2013.01); H01L 27/1259 (2013.01)

(58) Field of Classification Search
CPC ............ H01L 27/3244; H01L 27/1259; H01L 27/124
See application file for complete search history.

(56) References Cited

U.S. PATENT DOCUMENTS

| 2004/0012058 | A1 | 1/2004 | Aoki | |
| 2005/0127376 | A1* | 6/2005 | Young ................. | H01L 27/3225 257/80 |
| 2005/0255616 | A1* | 11/2005 | Childs ................. | H01L 27/3276 438/22 |
| 2007/0215876 | A1* | 9/2007 | Lee ........................ | H01L 27/124 257/59 |
| 2008/0012484 | A1* | 1/2008 | Park ..................... | H01L 51/5088 313/509 |
| 2009/0141060 | A1* | 6/2009 | Kwon .................... | B41J 3/28 347/14 |
| 2009/0184324 | A1* | 7/2009 | Oh ........................ | H01L 27/3276 257/72 |
| 2009/0231310 | A1* | 9/2009 | Tsai ...................... | H01L 27/124 345/205 |
| 2010/0044717 | A1* | 2/2010 | Choi .................... | H01L 29/458 257/72 |
| 2013/0161609 | A1* | 6/2013 | Koyama ............ | H01L 29/66969 257/43 |
| 2014/0054562 | A1 | 2/2014 | Lee | |
| 2014/0084293 | A1 | 3/2014 | Ahn et al. | |
| 2014/0111404 | A1* | 4/2014 | Omata ................... | G09G 3/32 345/76 |
| 2014/0167050 | A1* | 6/2014 | Jin .................... | H01L 29/66757 257/59 |
| 2014/0299881 | A1* | 10/2014 | Oda ..................... | H01L 27/124 257/59 |
| 2015/0144923 | A1* | 5/2015 | Choo .................. | H01L 27/3265 257/40 |

FOREIGN PATENT DOCUMENTS

| JP | 2003-215635 | 7/2003 |
| JP | 3901127 | 1/2007 |
| JP | 2007-149971 | 6/2007 |
| JP | 2014-107245 | 6/2014 |
| KR | 10-2014-0026196 | 3/2014 |

* cited by examiner

Primary Examiner — Thanh Y Tran
(74) Attorney, Agent, or Firm — Knobbe Martens Olson & Bear LLP

(57) ABSTRACT

An organic light-emitting display apparatus includes a gate electrode of a thin-film transistor (TFT) and a gate wiring electrically connected to the gate electrode and formed on different layers with an insulating layer disposed between the gate electrode and the gate wiring.

7 Claims, 3 Drawing Sheets

ORGANIC LIGHT-EMITTING DISPLAY APPARATUS AND METHOD OF MANUFACTURING THE SAME

CROSS-REFERENCE TO RELATED APPLICATIONS

This application claims the benefit of, and priority to, Korean Patent Application No. 10-2014-0145390, filed on Oct. 24, 2014, in the Korean Intellectual Property Office, the disclosure of which is incorporated herein in its entirety by reference.

BACKGROUND

1. Field

One or more embodiments relate to an organic light-emitting display apparatus and a method of manufacturing the same.

2. Description of the Related Technology

In general, an organic light-emitting display apparatus includes a thin-film transistor (TFT) and an organic light-emitting device. The organic light-emitting display apparatus forms a desired image by emitting light upon receiving an appropriate driving signal from the TFT.

The TFT typically has a structure in which an active layer, a gate electrode, a source electrode, and a drain electrode are stacked on a substrate. Accordingly, when a current is supplied to the gate electrode through a wiring that is formed on the substrate, the current flows through the active layer to the source electrode and the drain electrode and also flows to a pixel electrode of the organic light-emitting device that is connected to the drain electrode.

The organic light-emitting device includes the pixel electrode, a counter electrode that faces the pixel electrode, and an emission layer that is disposed between the pixel electrode and the counter electrode. When the current flows to the pixel electrode through the TFT as described above, an appropriate voltage is generated between the counter electrode and the pixel electrode, and thus the emission layer emits light, thereby an image being formed on the organic light-emitting device.

SUMMARY OF CERTAIN INVENTIVE ASPECTS

One or more embodiments include an organic light-emitting display apparatus and a method of manufacturing the same.

Additional aspects will be set forth in part in the description which follows and, in part, will be apparent from the description, or may be learned by practice of the presented embodiments.

According to one or more embodiments, an organic light-emitting display apparatus includes: a substrate; a thin-film transistor (TFT) formed on the substrate and including an active layer, a gate electrode, a source electrode, and a drain electrode; and a gate wiring electrically connected to the gate electrode, wherein the gate electrode and the gate wiring are formed on different layers with an insulating layer disposed therebetween.

The gate electrode may be formed on a first surface of the insulating layer close to the substrate and the gate wiring is formed on a second surface of the insulating layer opposite the first surface of the insulating layer.

A contact hole that passes through the gate wiring and the insulating layer may be formed in a region where the gate electrode and the gate wiring overlap each other.

A conductive layer may be filled in the contact hole to electrically connect the gate electrode and the gate wiring.

The conductive layer may be formed of a same material and on a same layer as the source electrode and the drain electrode.

An area of the gate electrode may be greater than an area of the gate wiring in the region where the gate wiring and the gate electrode overlap each other.

According to one or more embodiments, a method of manufacturing an organic light-emitting display apparatus includes: forming on a substrate a thin-film transistor (TFT) that includes an active layer, a gate electrode, a source electrode, and a drain electrode; forming a gate wiring so that the gate wiring and the gate electrode are formed on different layers with an insulating layer disposed therebetween; and electrically connecting the gate electrode and the gate wiring.

The insulating layer may be formed on the gate electrode and the gate wiring may be formed on the insulating layer.

Electrically connecting the gate electrode and the gate wiring may include: forming a contact hole that passes through the gate wiring and the insulating layer in a region where the gate electrode and the gate wiring overlap each other; and filling a conductive layer in the contact hole.

The conductive layer may be formed of a same material and on a same layer as the source electrode and the drain electrode.

An area of the gate electrode may be greater than an area of the gate wiring in the region where the gate wiring and the gate electrode overlap each other.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF CERTAIN INVENTIVE EMBODIMENTS

Figure 1:
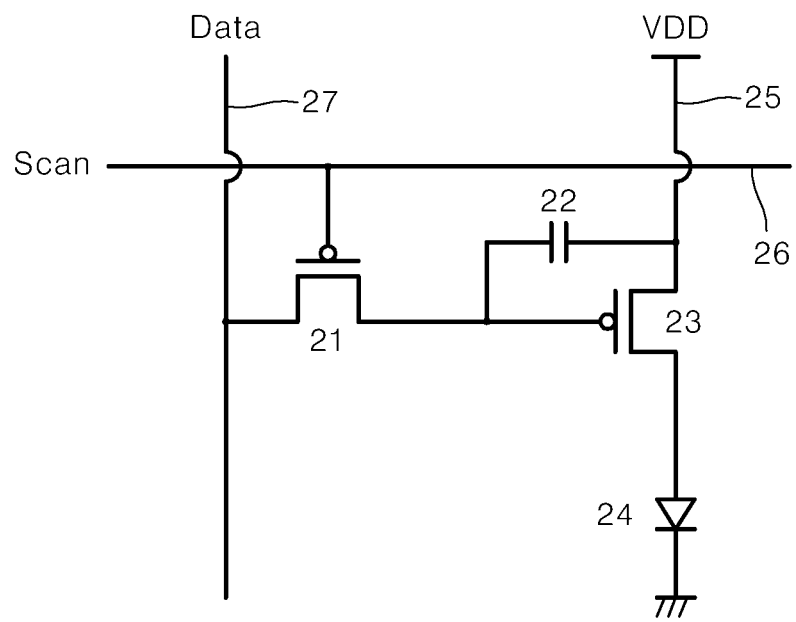
FIG. 1 is an equivalent circuit diagram illustrating one pixel included in an organic light-emitting display apparatus, according to an embodiment.

The inventive concepts may include various embodiments and modifications, and certain embodiments thereof will be illustrated in the drawings and will be described herein. The effects and features of the inventive concepts and the accompanying methods thereof will become apparent from the following description of the embodiments, taken in conjunction with the accompanying drawings. However, the inventive concepts are not limited to the embodiments described below, and may be embodied in various modes.

The inventive concepts will now be described more fully with reference to the accompanying drawings, in which certain embodiments are shown. In the drawings, the same or corresponding elements are generally denoted by the same reference numerals, and thus a repeated explanation thereof will not be given.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on" another layer, region, or component, it can be directly or indirectly formed on the other layer, region, or component. That is, for example, intervening layers, regions, or components may also be present.

Sizes of components in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be different from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

Figure 2:
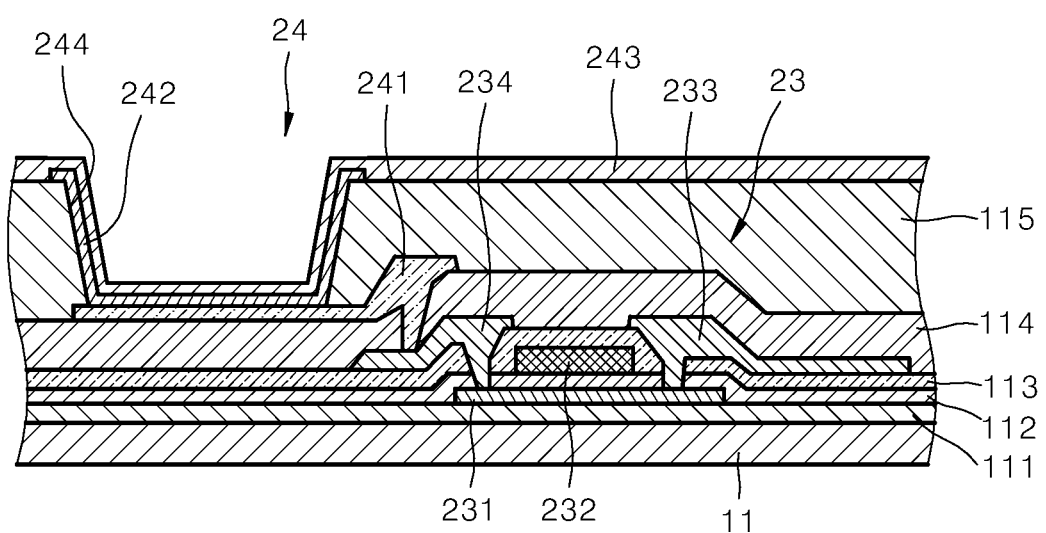
FIG. 2 is a cross-sectional view illustrating a thin-film transistor (TFT) and an organic light-emitting device of FIG. 1, according to an embodiment.

FIG. 1 is an equivalent circuit diagram illustrating one pixel included in an organic light-emitting display apparatus, according to an embodiment. FIG. 2 is a cross-sectional view illustrating a driving thin-film transistor (TFT) 23 and an organic light-emitting device 24 of FIG. 1, according to an embodiment.

Referring to FIG. 1, each pixel includes a switching TFT 21, a driving TFT 23, a capacitor 22, and an organic light-emitting device 24. It will be understood that the number of TFTs and capacitors is not limited thereto and more TFTs and capacitors may be provided in other embodiments.

The switching TFT 21 is driven by a scan signal that is applied to a gate line 26 and functions to transmit to the driving TFT 23 a data signal that is applied to a data line 27.

The driving TFT 23 determines the amount of current introduced to the organic light-emitting device 24 according to the data signal that is transmitted by the switching TFT 21.

The capacitor 22 functions to store the data signal that is transmitted by the switching TFT 21 for one frame.

From among the elements, cross-sectional views of the organic light-emitting device 24 and the driving TFT 23 are shown in FIG. 2.

The driving TFT 23 includes an active layer 231 that includes an amorphous silicon thin film or a polycrystalline silicon thin film on a buffer layer 111 that is formed on a substrate 11. The active layer 231 has source and drain regions that are heavily doped with N or P-type impurities. For reference, the active layer 231 may include an oxide semiconductor. For example, the oxide semiconductor may include an oxide from group 12, 13, and 14 metal elements such as, for example, zinc (Zn), indium (In), gallium (Ga), tin (Sn), cadmium (Cd), germanium (Ge), and hafnium (Hf) or a combination thereof. For example, the active layer 231 may include G—I—Z—O[$(In_2O_3)a(Ga_2O_3)b(ZnO)c$] (a, b, and c are real numbers satisfying a≥0, b≥0, and c>0).

A gate electrode 232 is formed on the active layer 231 with a first insulating layer 112 therebetween. A source electrode 233, which is connected to a driving power line 25 and applies a reference voltage to the active layer 231 for driving it, and a drain electrode 234, which connects the driving TFT 23 and the organic light-emitting device 24 and supplies driving power to the organic light-emitting device 24, are formed on the gate electrode 232. A second insulating layer 113 is disposed between the gate electrode 232 and the source and drain electrodes 233 and 234, and a passivation film 114 is disposed between the source and drain electrodes 233 and 234 and a first electrode 241 that is an anode of the organic light-emitting device 24.

An insulating planarization film 115 that includes acryl or the like is formed on the first electrode 241. A predetermined opening 244 is formed in the planarization film 115 and then the organic light-emitting device 24 is formed.

The organic light-emitting device 24 that displays predetermined image information by emitting red, green, and blue light according to the flow of current includes the first electrode 241 that is connected to the drain electrode 234 of the driving TFT 23 and acts as an anode for receiving positive power, a second electrode 243 that covers all pixels and acts as a cathode for supplying negative power, and an emission layer 242 that is disposed between the first and second electrodes 241 and 243 and emits light.

The first electrode 241 that acts as an anode may be formed as a transparent electrode including indium tin oxide (ITO) or the like, and the second electrode 243 that acts as a cathode is formed by entirely depositing aluminum (Al)/calcium (Ca) or the like through blanket deposition when the organic light-emitting display apparatus is a bottom-emission organic light-emitting display apparatus in which light is emitted toward the substrate 11. When the organic light-emitting display apparatus is a top-emission organic light-emitting display apparatus in which light is emitted toward an encapsulation member (not shown) that is opposite to the substrate 11, the second electrode 243 may include a transparent material by forming a transflective thin film formed of a metal such as, for example, magnesium (Mg)-silver (Ag) and then depositing transparent ITO on the transflective thin film. It will be understood that the second electrode 243 is not necessarily deposited and may be formed to have any of various patterns. Also, it will be understood that although the second electrode 243 is stacked over the first electrode 241 in FIG. 2, the first electrode 241 may be stacked over the second electrode 243 in other embodiments.

The emission layer 242 may be a low molecular or high molecular weight organic film. A hole injection layer (HIL), a hole transport layer (HTL), an electron transport layer (ETL), and an electron injection layer (EIL) may be further stacked adjacent to the emission layer 242.

For reference, the emission layer 242 may be formed in each pixel so that pixels that emit red, green, and blue light gather to form one unit pixel, or may be commonly formed over all pixels irrespective of positions of the pixels. In this case, the emission layer 242 may be formed by vertically stacking or mixing layers including light-emitting materials that emit red, green, and blue light. If white light may be emitted, another color combination may be used. Also, a color filter or a color conversion layer for converting the emitted white light into light of a predetermined color may be further provided.

The organic light-emitting display apparatus includes a plurality of TFTs such as the driving TFT 23 and the switching TFT 21 in each pixel, and in each of the plurality of TFTs, the active layer 231, the gate electrode 232, the source electrode 233, and the drain electrode 234 are stacked as described above.

A gate wiring 232a (see FIG. 3) is connected to the gate electrode 232. One embodiment includes a connection structure between the gate electrode 232 and the gate wiring 232a. The connection structure between the gate electrode 232 and the gate wiring 232a is explained below.

Figure 3:
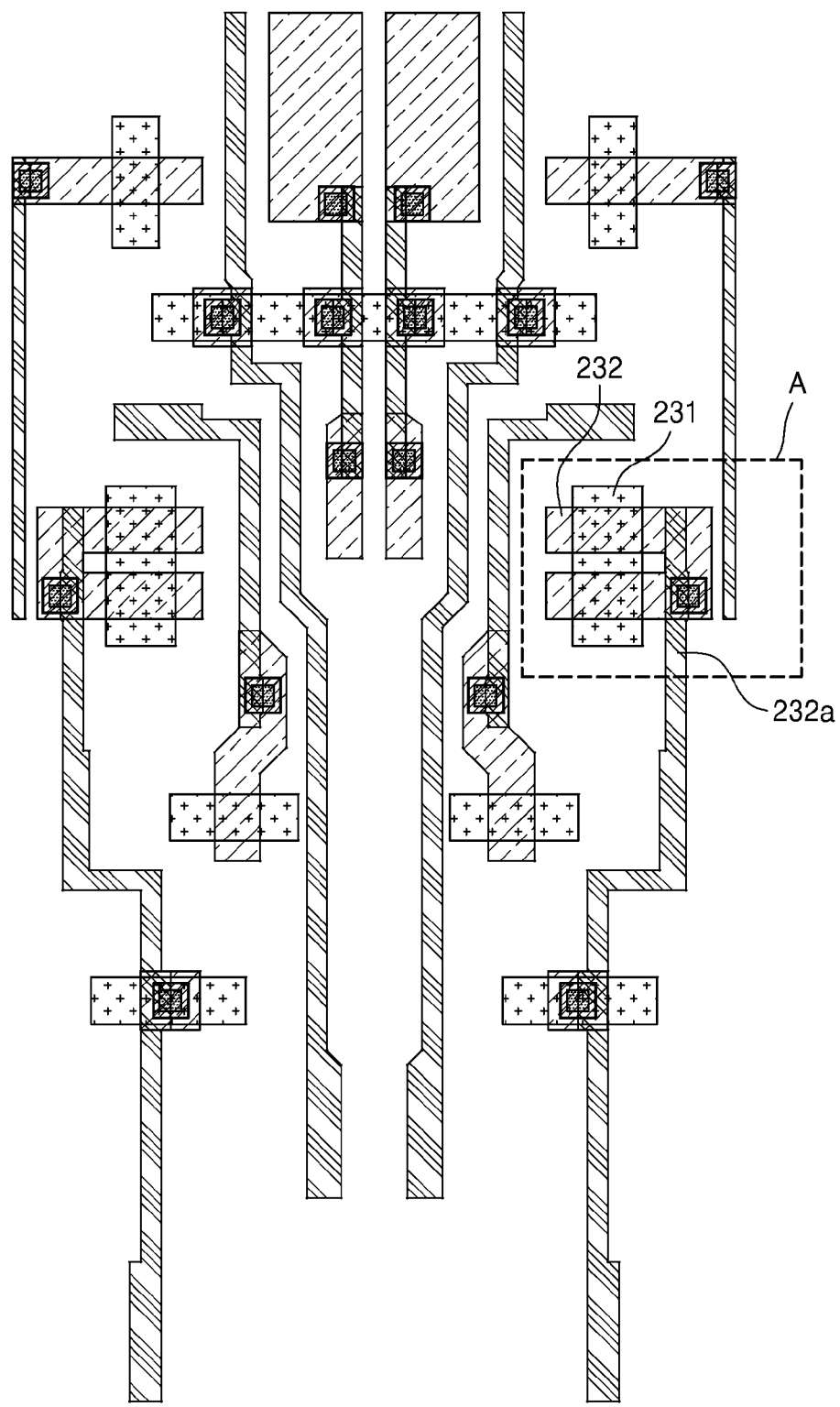
FIG. 3 is a plan view illustrating only an active layer, a gate electrode, and a gate wiring of the TFT of FIG. 1, according to an embodiment.

FIG. 3 is a plan view illustrating only the active layer 231, the gate electrode 232, and the gate wiring 232a of each of the plurality of TFTs that are included in the organic light-emitting display apparatus of FIG. 1, according to an embodiment. Although the source electrode 233, the drain electrode 234, and the like are included, only related layers are illustrated in FIG. 3 in order to effectively show the connection structure between the gate electrode 232 and the gate wiring 232a. The active layer 231 and the gate electrode 232 are disposed on each of areas where the plurality of TFTs are located and the gate wiring 232a is connected to the gate electrode 232.

Figure 4:
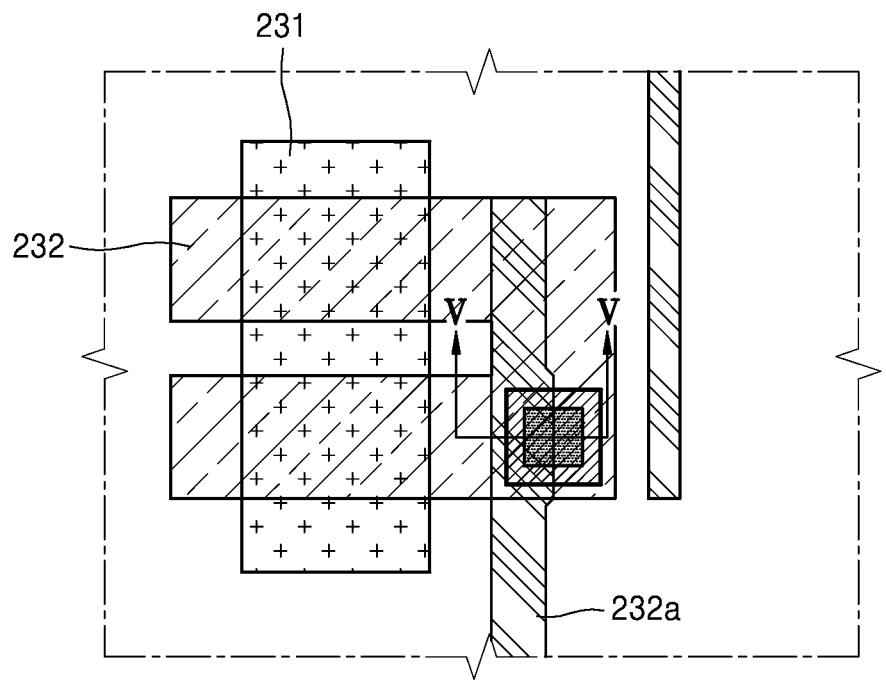
FIG. 4 is an enlarged plan view illustrating a portion A of FIG. 3, according to an embodiment.
Figure 5:
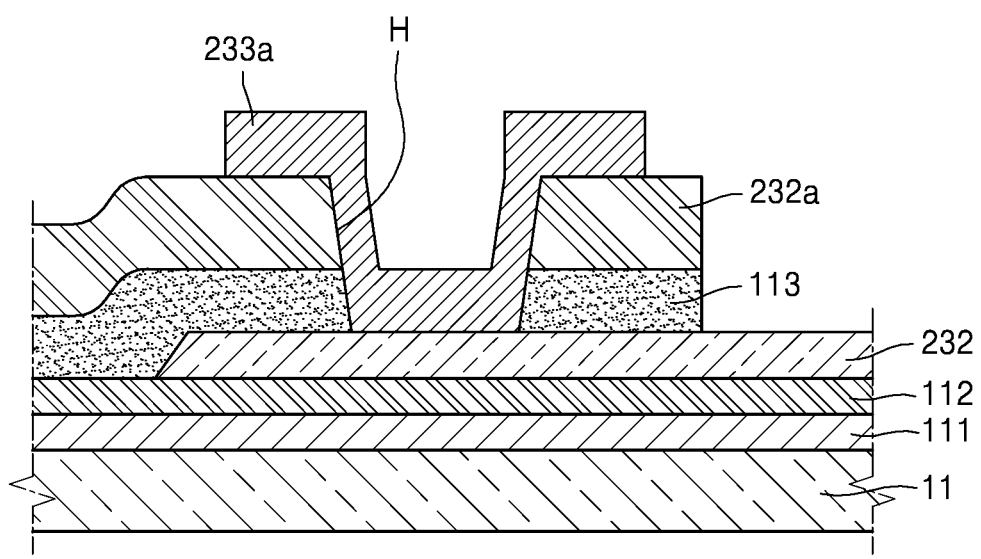
FIG. 5 is a cross-sectional view taken along line V-V of FIG. 4, according to an embodiment.

When the portion A illustrated in FIG. 3 is enlarged, the gate electrode 232 and the gate wiring 232a are connected to each other as shown in FIGS. 4 and 5. It will be understood that the gate electrode 232 and the gate wiring 232a are connected to each other in the same manner in other TFTs.

Referring to FIG. 5, the gate electrode 232 and the gate wiring 232a are vertically separated from each other to be disposed on different layers with the second insulating layer 113 therebetween. That is, the gate electrode 232 is formed on the first insulating layer 112 on the active layer 231 and the gate wiring 232a is formed on the second insulating layer 113 that is formed on the gate electrode 232.

Once the gate electrode 232 and the gate wiring 232a are formed on different layers, the gate electrode 232 and the gate wiring 232a may be easily patterned according to their characteristics. That is, it is required that the gate wiring 232a should be formed to have a small width in order to ensure a high resolution and the gate electrode 232 should be formed to have a large width in order to improve characteristics of the TFTs. Accordingly, if the gate electrode 232 and the gate wiring 232a are formed on the same layer, the requirements for desired patterning conflict and thus it is very difficult to satisfy the requirements for desired patterning. However, if the gate electrode 232 and the gate wiring 232a are disposed on different layers, the requirements for desired patterning may be easily satisfied and thus product quality may be improved.

Referring to FIG. 4, in a region where the gate electrode 232 and the gate wiring 232a overlap each other, an area of the gate electrode 232 is much greater than an area of the gate wiring 232a. That is, if the gate electrode 232 and the gate wiring 232a are connected to each other on the same layer, since a width of a connected portion has to be small like that of the gate wiring 232a or has to be large like that of the gate electrode 232, one from among the advantage of a high resolution and the advantage of improved characteristics of the TFTs has to be given up. However, since the gate electrode 232 and the gate wiring 232a are formed on different layers, and thus the gate electrode 232 may be formed to have a large width and the gate wiring 232a may be formed to have a small width according to their characteristics, the organic light-emitting display apparatus having the two advantages may be realized.

The gate electrode 232 and the gate wiring 232a that are formed on different layers have to be electrically connected to each other. To this end, when seen from the upper side (of the second insulating layer 113) of FIG. 5, a contact hole H that passes from the gate wiring 232a, which is opposite to the substrate 11, to the second insulating layer 113 is formed to expose the gate electrode 232. Next, a conductive layer 233a is filled in the contact hole H to electrically connect the gate electrode 232 and the gate wiring 232a. That is, the contact hole H is formed in one of regions where the gate electrode 232 and the gate wiring 232a vertically overlap each other and the conductive layer 233a is filled in the contact hole H to electrically connect the gate electrode 232 and the gate wiring 232a. The conductive layer 233a may be formed as a separate layer, and may be formed of the same material and on the same layer as the source electrode 233 and the drain electrode 234.

A process of manufacturing the connection structure between the gate electrode 232 and the gate wiring 232a is explained below.

The buffer layer 111, the active layer 231, and the first insulating layer 112 are sequentially formed on the substrate 11, and then the gate electrode 232 is formed thereon according to appropriate patterning conditions.

The second insulating layer 113 is formed on the gate electrode 232, and the gate wiring 232a is formed on the second insulating layer 113 according to patterning conditions suitable for the gate wiring 232a.

Next, the contact hole H that passes through the gate wiring 232a and the second insulating layer 113 is formed, the conductive layer 233a is filled in the contact hole H, and the gate electrode 232 and the gate wiring 232a are electrically connected to each other. In this case, the conductive layer 233a may be formed as a separate layer or may be formed of the same material on the same layer as the source electrode 233 and the drain electrode 234 as described above.

As described above, by using the organic light-emitting display apparatus and the method of manufacturing the same according to the one or more of the embodiments, a structure including a gate electrode having a large width to improve characteristics of TFTs and including a gate wiring having a small width to ensure a high resolution may be easily realized.

While one or more embodiments have been described with reference to the figures, it will be understood by those of ordinary skill in the art that various changes in form and details may be made therein without departing from the spirit and scope as defined by the following claims. Accordingly, the true technical scope of the inventive concept is defined by the technical spirit of the appended claims.

What is claimed is:

1. An organic light-emitting display apparatus comprising:
 a substrate;
 a thin-film transistor (TFT) formed on the substrate and comprising an active layer, a gate electrode, a source electrode, and a drain electrode;
 a gate wiring electrically connected to the gate electrode; and
 an insulating layer,
 wherein the gate electrode is formed on a first surface of the insulating layer close to the substrate and the gate wiring is formed on a second surface of the insulating layer opposite the first surface of the insulating layer, and
 wherein a contact hole that passes through the gate wiring and the insulating layer is formed in a region where the gate electrode and the gate wiring overlap each other.

2. The organic light-emitting display apparatus of claim 1, wherein a conductive layer is filled in the contact hole to electrically connect the gate electrode and the gate wiring.

3. The organic light-emitting display apparatus of claim 2, wherein the conductive layer is formed of a same material and on a same layer as the source electrode and the drain electrode.

4. The organic light-emitting display apparatus of claim 1, wherein an area of the gate electrode is greater than an area of the gate wiring in the region where the gate wiring and the gate electrode overlap each other.

5. A method of manufacturing an organic light-emitting display apparatus, the method comprising:
- forming on a substrate a thin-film transistor (TFT) that comprises an active layer, a gate electrode, a source electrode, and a drain electrode;
- forming a gate wiring so that the gate wiring and the gate electrode are formed on different layers with an insulating layer disposed therebetween, wherein the insulating layer is formed on the gate electrode and the gate wiring is formed on the insulating layer;
- forming a contact hole that passes through the gate wiring and the insulating layer in a region where the gate electrode and the gate wiring overlap each other and filling a conductive layer in the contact hole to electrically connect the gate electrode and the gate wiring.

6. The method of claim 5, wherein the conductive layer is formed of a same material and on a same layer as the source electrode and the drain electrode.

7. The method of claim 5, wherein an area of the gate electrode is greater than an area of the gate wiring in the region where the gate wiring and the gate electrode overlap each other.

* * * * *